(12) United States Patent
Taylor, Jr. et al.

(10) Patent No.: US 6,849,515 B1
(45) Date of Patent: Feb. 1, 2005

(54) SEMICONDUCTOR PROCESS FOR DISPOSABLE SIDEWALL SPACERS

(75) Inventors: William J. Taylor, Jr., Round Rock, TX (US); Cesar M. Garza, Round Rock, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/670,634

(22) Filed: Sep. 25, 2003

(51) Int. Cl.[7] .............................................. H01L 21/336
(52) U.S. Cl. ...................... 438/301; 438/304; 438/306
(58) Field of Search ................................ 438/301, 304, 438/306

(56) References Cited

U.S. PATENT DOCUMENTS

| | | | | |
|---|---|---|---|---|
| 5,320,974 A | * | 6/1994 | Hori et al. ................... | 438/302 |
| 6,087,239 A | * | 7/2000 | Juengling ................... | 438/305 |
| 6,121,093 A | | 9/2000 | Cheng et al. ............... | 438/286 |

OTHER PUBLICATIONS

Wolf, Stanley Wolf Ph.D. and Richard N. Tauber Ph.D. in Silicon Processing for the VLSI Era, vol. 1: Process Technology, Lattice Press, 1986, pp. 546–551.*

Ranade, Pushkar et al.; "Application of Silicon–Germanium in the Fabrication of Ultra–shallow Extension Junctions for Sub–100 nm PMOSFETs"; IEEE Transactions on Electron Devices; Aug. 2002'; pp 1436–1443; vol. 49, No. 8; IEEE.

Parrillo, Louis C. et al.; "An Advanced 0.5$\mu$m CMOS Disposable LDD Spacer Technology"; Motorola, Advanced Products Research and Development Laboratory; Austin, TX.

U.S. Appl. No. 10/339,062, filed Jan. 2, 2003.

U.S. Appl. No. 10/631,283, filed Jul. 31, 2003.

* cited by examiner

Primary Examiner—William M. Brewster
(74) Attorney, Agent, or Firm—Robert L. King

(57) ABSTRACT

A semiconductor process and structure (32) uses a disposable sidewall spacer (42) associated with lightly doped drain (LDD) transistors. The disposable sidewall spacers are efficiently removed by a gaseous fluorine ambient. Either molecular or atomic fluorine gas is used to remove a silicon germanium sidewall spacer with high selectivity to exposed insulating layers. This etch process is also isotropic. An additional benefit of using a gaseous fluorine ambient is incorporation of fluorine in isolation regions (48) surrounding the transistors, thereby reducing the dielectric constant. Improved insulating properties of the isolations regions can allow increased integration.

17 Claims, 2 Drawing Sheets

SEMICONDUCTOR PROCESS FOR DISPOSABLE SIDEWALL SPACERS

CROSS REFERENCE TO RELATED APPLICATIONS

This application is related to copending U.S. application Ser. No. 10/339,062, entitled "Method of Making A Semiconductor Device Using A Pellicle That is Transparent At Short Wavelengths" filed on Jan. 9, 2003 and assigned to the assignee herein; and Copending U.S. application Ser. No. 10/631,283, entitled "Semiconductor Device And Method For Elimination Of Resist Linewidth Slimming By Flourination".

FIELD OF THE INVENTION

This invention relates to semiconductors, and more particularly to transistors that use sidewall spacers.

RELATED ART

In conventional CMOS semiconductor processing, transistors known as lightly doped drain (LDD) transistors have been utilized for many years. LDD transistors function to enhance the control of electrical conduction of the transistor by using source and drain regions removed from a gate channel region. These LDDs or "extensions to the source and drain regions" are substantially aligned to the transistor's gate edge. These extensions are diffused regions like the source and drain regions, but are implemented with a lower energy and with a lower implant dose so that the extensions do not extend into the substrate as much as the source and drain. Conventional processing to form LDD transistors includes implanting the extensions followed by a spacer formation. The source and drain are then implanted into the substrate and annealed. Thus the extension implants are exposed to the same temperature cycling required for the spacer deposition and the source and drain annealing.

In contrast, LDD transistors may also be formed by using disposable sidewall spacers. An advantage of the use of disposable sidewall spacers is the avoidance of the thermal processes required to form the spacer, and activate the source/drain implants. As a result, a very abrupt junction interface between the channel and source/drain may be created. A well-defined junction interface minimizes resistance of the transistor.

A disadvantage with known processes used to remove sidewall spacers is the fact that a portion of the sidewall spacer is often left and modifies the transistor's electrical characteristics. The portion of the sidewall spacer that is typically left adjacent a gate electrode is commonly referred to as a "stringer".

If the etch process is performed long enough to assure that all of the sidewall spacer is removed, the additional etching typically also negatively modifies other layers of the transistor, such as insulating layers, or even the source/drain region itself. The ratio of the removal rate of the sidewall spacer as compared to the removal rate of other layers is a critical figure of merit and represents the selectivity of an etchant. Various etchants have been proposed in addition to various sidewall spacer materials, in order to improve the selectivity. For example, nitrides are often used as a sidewall spacer material. However, various known nitride etchants are not very selective and will commonly etch completely through the insulating layers before all of the sidewall spacer can be removed. To avoid significantly modifying the insulating layers, sidewall stringers must be left, thereby undesirably modifying the electrical parameters of the transistors. In addition to high selectivity, another important characteristic in the etching of sidewall spacers is that the etching should be isotropic (i.e. the etchant rate is essentially the same in all directions). An isotropic etchant allows more rapid removal of the spacers that typically have a high aspect ratio, and thus are not easily removed with an anisotropic etch.

One can improve the selectivity by changing the sidewall spacer material to silicon germanium as taught in U.S. Pat. No. 6,121,093 by Cheng et al. entitled "Method of Making Asymmetrical Transistor Structures". Cheng et al. teach a wet etch chemistry for selectively removing silicon germanium. A wet etch chemistry, although isotropic, does not easily permit a single wafer process because modifications to the etchant to refresh the chemistry are typically needed after each or several wafers are processed. Additionally, liquid etchants present an environmental issue and must be safely stored and disposed of, thereby resulting in significant manufacturing costs.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
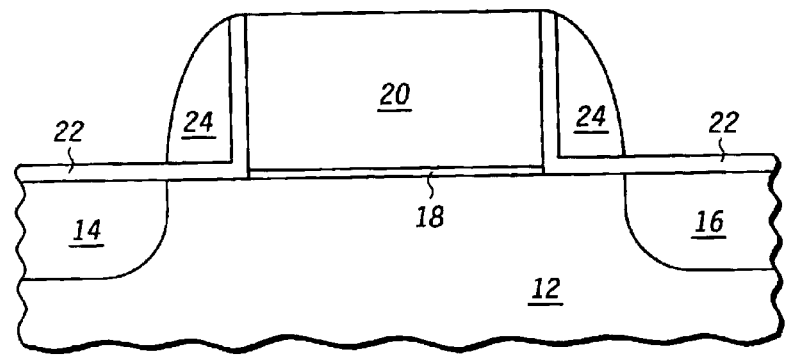
FIG. 1 illustrates in cross-sectional form a conventional transistor sidewall spacer structure.

Illustrated in FIG. 1 is a conventional lightly doped drain (LDD) transistor 10. Within a substrate 12 are a source diffusion 14 and a drain diffusion 16. Overlying the substrate is a thin gate oxide 18 and overlying the thin gate oxide 18 is a gate electrode 20. An insulating layer 22 is formed overlying the remaining exposed portion of substrate 12 and overlying the source diffusion 14 and the drain diffusion 16. Formed adjacent the gate electrode 20 and in contact with the insulating layer 22 is a sidewall spacer 24. The sidewall spacer 24 is used for alignment in the placement of the source diffusion 14 and the drain diffusion 16. Sidewall spacer 24 therefore functions as a standoff from the transistor channel region underlying the gate electrode 20. If the source diffusion 14 and drain diffusion 16 were immediately adjacent the edge of the gate electrode 20, the depth of the diffusions would allow undesired migration of electrons significantly below the bottom surface of the gate electrode 20 and thereby unintentionally modify the electrical parameters of the transistors. Therefore drain and source shallower extensions from drain diffusion 16 and source diffusion 14 are created. In order to create these extensions, the sidewall spacer 24 must be removed.

Figure 2:
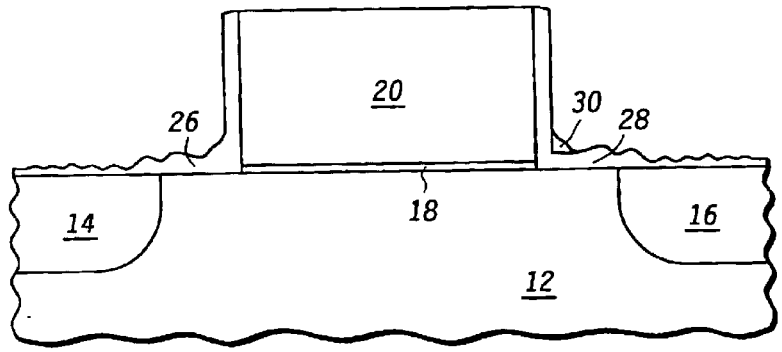
FIG. 2 illustrates in cross-sectional form the conventional transistor sidewall spacer structure of FIG. 1 after removal of sidewall spacers.

Illustrated in FIG. 2 is a conventional LDD transistor structure after removal of a disposable sidewall spacer. Transistor 10 has sidewall spacer 24 removed, but there is a residual spacer 30. Additionally, insulating layer 26 on the left of the gate electrode 20 has been significantly etched and in an uneven manner. Further, insulating layer 28 on the right of the gate electrode 20 is etched and is very non-planar. As a result, any structure formed overlying insulating layer 26 and insulating layer 28 may possibly make contact all the way through the insulating layers 26 and 28. Additionally, should source and drain extensions be formed within the transistor 10, the presence of residual spacer 30 will block the extension from drain diffusion 16 from extending all the way to the vertical edge of insulating layer 28.

Figure 3:
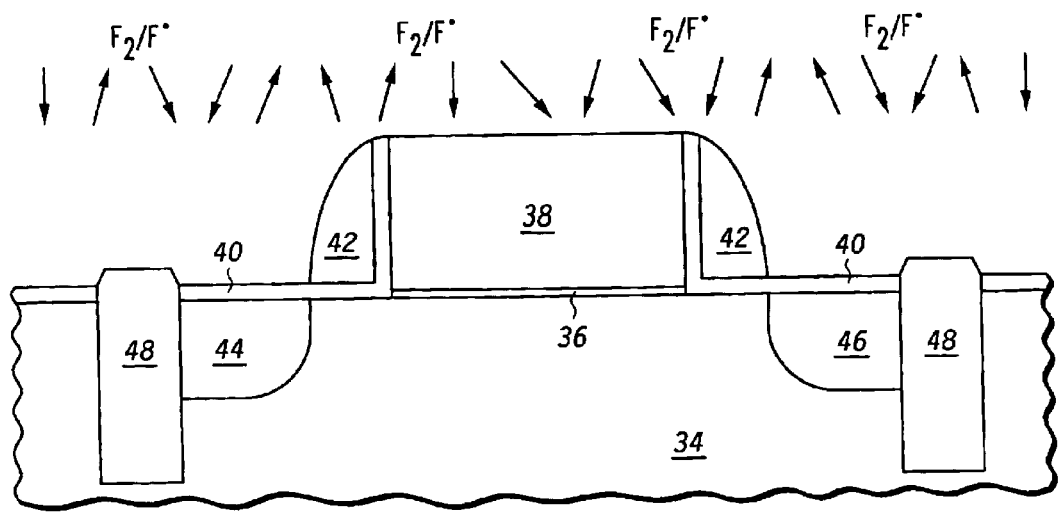
FIG. 3 illustrates in cross-sectional form a transistor structure with disposable sidewall spacers in accordance with the present invention.

Illustrated in FIG. 3 is a cross-section of a transistor 32 in accordance with one form of the present invention. A substrate 34 has an isolation region 48 that surrounds and isolates transistor 32 from other devices formed within substrate 34. The isolation region 48 surrounds transistor 32 and therefore from a cross-sectional view has a left component and a right component. Transistor 32 has a gate insulator 36 that is typically a thin oxide layer. A control electrode or gate 38 overlies the gate insulator 36. Adjacent the vertical sides of the gate 38 and overlying the substrate 34 and extending to the isolation region 48 is an insulating layer 40. A sidewall spacer 42 is formed adjacent the gate 38 and in direct contact with insulating layer 40. Within the substrate 34 is formed a source diffusion 44 and a drain diffusion 46 which are aligned to an outer edge of sidewall spacer 42. Up to this point in the discussion, the structure of transistor 32 is conventional for a disposable spacer process. In one form, sidewall spacer 42 is composed of silicon germanium. Other forms of sidewall spacer 42 may also use polysilicon rather than silicon germanium. Also, although less beneficial, a silicon nitride sidewall spacer may also be used herein. It is desired that sidewall spacer 42 be removed to facilitate the subsequent formation of extensions of source diffusion 44 and drain diffusion 46 toward the channel region underlying gate 38. We have discovered a method of removing sidewall spacer 42 using a gaseous fluorine environment that is very selective and isotropic. In other words, sidewall spacer 42 is removed without also etching other exposed surfaces such as gate 38 or insulating layers 36 and 40 in a negative manner. Transistor 32 is exposed to a F2 (molecular fluorine) or an F (atomic fluorine) ambient. Molecular fluorine is commercially available in a range of concentrations suitable for this application. One way to generate the atomic fluorine gas is to use a downstream etch. A convenient way to generate atomic fluorine gas is to dissociate a fluorine-containing gas like $NF_3$ (nitrogen trifluoride), $F_2$ (molecular fluorine) or $XeF_2$ (xenon difluoride) in a discharge plasma and carry the atomic fluorine to an adjoining chamber with the wafer using an inert gas such as $N_2$ (nitrogen), He (helium) or Ar (argon). The adjoining chamber is downstream from the chamber used to dissociate the fluorine-containing gas. Therefore, in FIG. 3, transistor 32 is exposed to atomic fluorine rather than molecular or ionic fluorine. Atomic fluorine reacts preferentially with silicon germanium while it does not react with the silicon dioxide insulating layers achieving selectivity from anywhere in a range of substantially 50 to 1 up to over 1,000 to 1 depending upon pressure and temperature conditions as well as the compositions of the sidewall spacer and the insulating layer. The atomic fluorine gas has a same probability that it will move in any direction as illustrated in FIG. 3. Therefore, the etch process is occurring at a same etch rate in all directions. This property is responsible for the isotropic etching and this is a very important feature in the complete and selective removal of sidewall spacer 42.

Figure 4:
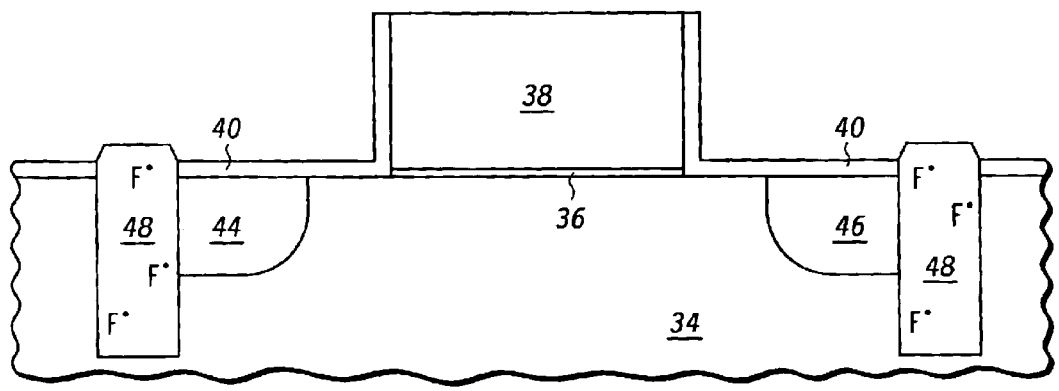
FIGS. 4 and 5 illustrate in cross-sectional form processing of the transistor structure of FIG. 3 after removal of disposable sidewall spacers.

Illustrated in FIG. 4 is a cross-section of transistor 32 after removal of sidewall spacer 42 by using atomic fluorine to react with the silicon germanium sidewall spacer 42. An additional benefit is achieved as a result of the removal of sidewall spacer 42. In particular, the isolation region 48 now contains fluorine. A common material used to implement isolation region 48 is an oxide layer, such as TEOS oxide or plasma oxide. The atomic fluorine reacts with the oxide to form a fluorine-doped oxide that results in reducing the dielectric constant. A reduced dielectric constant results in improved insulating characteristics thereby improving the insulation between transistors within substrate 34. As a result, the width of the isolation region may be reduced and the packing density of the integrated circuit is improved. In other words, less distance between electrically isolated devices is required.

Figure 5:
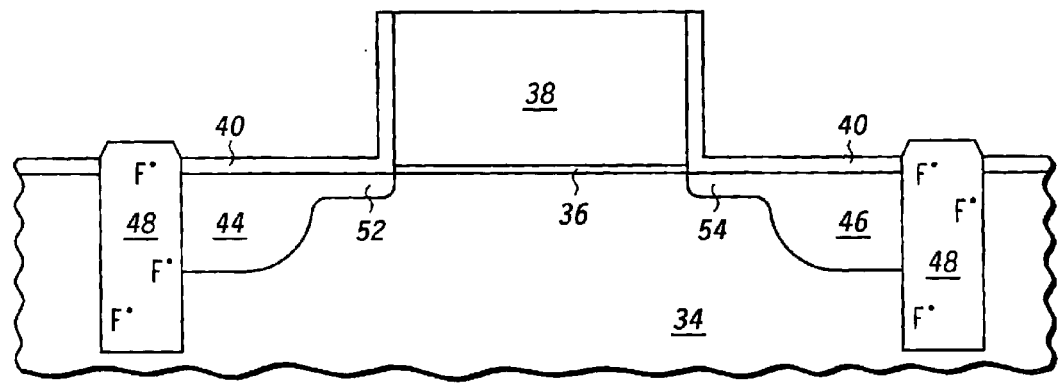

Illustrated in FIG. 5 is a cross-section of transistor 32 after drain and source extensions have been created with lightly doped diffusions 52 and 54. The lightly doped diffusions 52 and 54 are typically formed by an implant. After activation by a thermal anneal, the source diffusion 44 and lightly doped diffusion 52 is a continuous region. Similarly, after activation by a thermal anneal, the drain diffusion 46 and lightly doped diffusion 54 is a continuous region. Further, since the sidewall spacer 42 has been completely removed with selectivity, the insulating layers 36 and 40 in FIG. 5 are not degraded from the size and shape in which they were originally formed.

Figure 6:
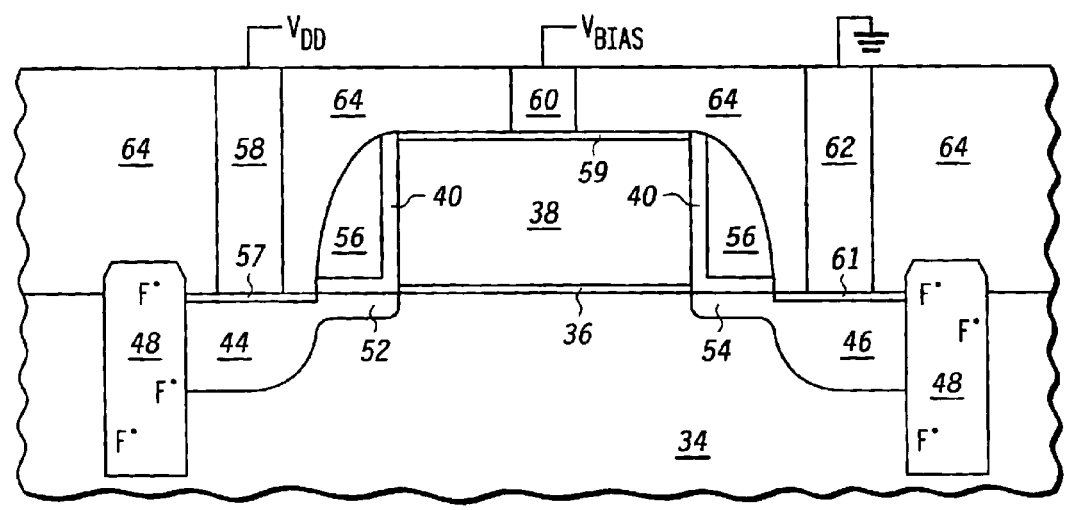
FIG. 6 illustrates in cross-sectional form a completed transistor structure in accordance with the present invention.

Illustrated in FIG. 6 is a cross-section of a completed form of transistor 32. Electrical contact to source diffusion 44, drain diffusion 46 and gate 38 are formed respectively by conductive vias 58, 60 and 62 formed through an insulator 64 that is, in one form, conformally deposited over transistor 32 and respectively connecting to a silicide layer 57, a silicide layer 59 and a silicide layer 61. For subsequent operation, the conductive via 58 is connected to a positive supply voltage $V_{DD}$, the conductive via 60 is connected to a bias voltage, $V_{BIAS}$, and the conductive via 62 is connected to a ground reference voltage terminal.

By now it should be appreciated that there has been provided a process for removing transistor sidewall spacers that has a high degree of selectivity and a semiconductor having improved transistor isolation regions containing fluorine to increase the dielectric constant and insulating properties. The improved insulation characteristics are achieved with a same step used to effectively completely remove disposable sidewall spacers. By effectively removing disposable sidewall spacers without leaving any residual sidewall material, an abrupt or well-defined gate channel region and source/drain regions are provided. Additionally, no etch damage to the gate oxide 56 occurs unlike less selective conventional sidewall removal processes. Further, the isolation regions containing fluorine minimize the size of integrated circuits by using isolation regions of smaller width.

In one form there has been disclosed a method of forming a semiconductor structure in which a substrate is provided and a control electrode is formed overlying the substrate. The control electrode includes a sidewall. An insulating layer is formed that is adjacent to the control electrode and overlying the substrate. A sidewall spacer is formed around the sidewall of the control electrode and in contact with the insulating layer. A current electrode diffusion region is formed in the substrate substantially aligned to said sidewall spacer. The semiconductor structure is exposed to a gaseous fluorine ambient to substantially remove said sidewall spacer. An extension region to said current electrode diffusion region is formed in the substrate, the extension region being substantially aligned to the control electrode. In one form the insulating layer is an oxide layer. In one form the sidewall spacer is one of silicon, silicon germanium, or germanium. In one form the gaseous fluorine ambient is molecular fluorine and in another form the gaseous fluorine ambient is atomic fluorine. In one form the atomic fluorine is generated from a plasma. In one form the plasma is nitrogen trifluoride, xenon difluoride or molecular fluorine. In another form the semiconductor structure is exposed to the gaseous fluorine ambient to substantially remove said sidewall spacer without substantially modifying said insulating layer. In another form the sidewall spacer is etched with the gaseous fluorine ambient selective to the insulating layer. In another form the sidewall spacer is etched with the gaseous fluorine ambient selective to said insulating layer by a factor of at least fifty to one. In another form the semiconductor structure is surrounded with a dielectric isolation region. In another form the semiconductor structure is exposed to the gaseous fluorine ambient to substantially remove the sidewall spacer and to introduce fluorine into the dielectric isolation region. In another form the dielectric isolation region is exposed to a gas to improve the insulating characteristics of said dielectric isolation region. In yet another form there has been taught a method of forming a semiconductor structure by providing a substrate and forming a control electrode overlying the substrate. The control electrode includes a sidewall. An insulating layer is formed adjacent to the control electrode and overlying said substrate. A sidewall spacer is formed around the sidewall of the control electrode and in contact with the insulating layer. A current electrode diffusion region is formed in the substrate substantially aligned to said sidewall spacer. The semiconductor structure is laterally isolated with a dielectric region. The semiconductor structure is exposed to a gaseous fluorine ambient to substantially remove the sidewall spacer and to add fluorine to the dielectric region. An extension region to said current electrode diffusion region is formed in the substrate. The extension region is substantially aligned to the control electrode. In another form the isolating region is an oxide layer. In another form the gaseous fluorine ambient is molecular fluorine. In another form the gaseous fluorine ambient is atomic fluorine. In another form the atomic fluorine is generated from plasma. In another form the plasma is at least one of nitrogen trifluoride, xenon difluoride or molecular fluorine. In another form the isolating region is an oxide layer. In yet another form a method of forming a semiconductor structure includes providing at least two semiconductor structures. The at least two semiconductor structures are laterally isolated with a dielectric region. The at least two semiconductor structures including said dielectric region are exposed to a gaseous fluorine ambient. A first semiconductor structure and a second semiconductor structure of the at least two semiconductor structures are laterally adjacent. In another form a semiconductor structure has a substrate having an overlying dielectric layer. A control electrode overlies the substrate, and the control electrode includes a sidewall. An insulating layer is adjacent to the sidewall of the control electrode and at least a portion of the substrate. A sidewall spacer is adjacent to the insulating layer which is adjacent to the sidewall of the control electrode and the substrate. A current electrode diffusion region portion is substantially aligned to the control electrode. An isolating region surrounds the semiconductor structure, said isolating region being a dielectric that contains fluorine. There has also been disclosed a structure having at least a first and a second semiconductor structure which are laterally adjacent. A dielectric region laterally isolates the first semiconductor structure from the second semiconductor structure. The dielectric region contains fluorine. At least the first semiconductor structure further includes a control electrode overlying said substrate, the control electrode including a sidewall. An insulating layer is adjacent to the sidewall of the control electrode and at least a portion of the substrate. A sidewall spacer is adjacent to the insulating layer which is adjacent to the control electrode and the insulating layer which is adjacent to the substrate. A current electrode diffusion region in said substrate is substantially aligned to the sidewall spacer.

In the foregoing specification, the invention has been described with reference to specific embodiments. However, one of ordinary skill in the art appreciates that various modifications and changes can be made without departing from the scope of the present invention as set forth in the claims below. For example, various materials may be used for the substrate and insulating layers. Additionally, it should be understood that for some semiconductor devices there is no need to use a dielectric layer between the substrate and the gate electrode. Various dopant concentrations, temperature and pressure ranges may be used depending upon the particular process that the removable sidewall spacer steps described herein are used.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor structure comprising:

providing a substrate;

forming a control electrode overlaying said substrate, said control electrode including a sidewall;

forming an insulating layer that is adjacent to said control electrode and overlaying said substrate;

forming a silicon germanium sidewall spacer around said sidewall of said control electrode and in contact with said insulating layer;

forming a current electrode diffusion region in said substrate substantially aligned to said silicon germanium sidewall spacer;

exposing the semiconductor structure to atomic or molecular fluorine to substantially remove said silicon germanium sidewall spacer; and forming an extension region to said current electrode diffusion region in said substrate, said extension region substantially aligned to said control electrode.

2. The method of claim 1, further comprising implementing said insulating layer as an oxide layer.

3. The method of claim 1, further comprising generating said atomic or molecular fluorine from a plasma.

4. The method of claim 3, further comprising implementing said plasma from at least one of nitrogen trifluoride, xenon difluoride or molecular fluorine.

5. The method of claim 1, further comprising:
exposing the semiconductor structure to said atomic or molecular fluorine to substantially move said sidewall spacer without substantially modifying said insulating layer.

6. The method of claim 1, further comprising:
etching said sidewall spacer with said atomic or molecular fluorine selective to said insulating layer.

7. The method of claim 1, further comprising:
etching said silicon germanium sidewall spacer with said atomic or molecular fluorine selective to said insulating layer by a factor of at least fifty to one.

8. The method of claim 1, further comprising:
surrounding the semiconductor structure with a dielectric isolation region.

9. The method of claim 8, further comprising:
exposing the semiconductor structure to said atomic or molecular fluorine to substantially remove said silicon germanium sidewall spacer and to introduce fluorine into said dielectric isolation region.

10. The method of claim 8, further comprising:
exposing said dielectric isolation region to a gas to improve insulating characteristics of said dielectric isolation region.

11. A method of forming a semiconductor structure comprising:
providing a substrate;
introducing a dielectric region within the substrate to laterally electrically isolate the semiconductor structure;
forming a thin control electrode oxide overlying the substrate;
forming a control electrode overlying said thin control electrode oxide, said control electrode including a sidewall;
forming an insulating layer that is adjacent to said control electrode and overlying said substrate;
forming a silicon germanium sidewall spacer around said sidewall of said control electrode and in contact with said insulating layer;
forming a current electrode diffusion region in said substrate substantially aligned to said silicon germanium sidewall spacer;
exposing the semiconductor structure to atomic or molecular fluorine to substantially remove said silicon germanium sidewall spacer and to add fluorine to said dielectric region; and
forming an extension region to said current electrode diffusion region in said substrate, said extension region substantially aligned to said control electrode.

12. The method of claim 11, further comprising implementing the dielectric region as an oxide layer.

13. The method of claim 11, further comprising generating said atomic or molecular fluorine from a plasma.

14. The method of claim 13, further comprising implementing said plasma as at least one of nitrogen trifluoride, xenon difluoride or molecular fluorine.

15. The method of claim 14, further comprising implementing said dielectric region as a oxide layer.

16. A method of forming a semiconductor structure comprising:
providing at least two semiconductor structures, each of the at least two semiconductor structures having a silicon germanium element;
laterally isolating said at least two semiconductor structures with a dielectric region; and
exposing said at least two semiconductor structures including said dielectric region to atomic fluorine or molecular fluorine to remove the silicon germanium element, the dielectric region having a resulting lower dielectric constant.

17. The method of claim 16, wherein a first semiconductor structure and a second semiconductor structure of said at least two semiconductor structures are laterally adjacent transistors.

* * * * *

UNITED STATES PATENT AND TRADEMARK OFFICE
CERTIFICATE OF CORRECTION

PATENT NO. : 6,849,515 B1
DATED : February 1, 2005
INVENTOR(S) : William J. Taylor Jr. et al.

It is certified that error appears in the above-identified patent and that said Letters Patent is hereby corrected as shown below:

Column 6,
Lines 54 and 57, change "overlaying" to -- overlying --.

Column 7,
Line 13, change "move" to -- remove --.

Column 8,
Line 27, change "a" to -- an --.

Signed and Sealed this

Fourth Day of April, 2006

JON W. DUDAS
*Director of the United States Patent and Trademark Office*